United States Patent [19]

Meulenbrugge et al.

[11] Patent Number: 5,713,357
[45] Date of Patent: Feb. 3, 1998

[54] IMAGING SYSTEM COMPRISING MAGNETIC RESONANCE AND X-RAY IMAGING DEVICES

[75] Inventors: Hendrik J. Meulenbrugge; Hans H. Tuithof; Johannes J. Van Vaals, all of Eindhoven, Netherlands

[73] Assignee: U.S. Philips Corporation, New York, N.Y.

[21] Appl. No.: 498,288

[22] Filed: Jun. 30, 1995

[30] Foreign Application Priority Data

Jun. 30, 1994 [EP] European Pat. Off. ............ 94201885.4

[51] Int. Cl.⁶ .................................................. A61B 5/055
[52] U.S. Cl. .................... 128/653.2; 378/63; 324/307; 128/653.1
[58] Field of Search ............................ 128/653.1, 653.2; 324/307, 309; 364/413.13, 413.14; 378/62, 63

[56] References Cited

U.S. PATENT DOCUMENTS

| | | | |
|---|---|---|---|
| 4,907,252 | 3/1990 | Aichinger et al. | 378/99 |
| 5,178,146 | 1/1993 | Giese | 128/653.2 |
| 5,184,018 | 2/1993 | Conrads et al. | 250/370.09 |
| 5,211,165 | 5/1993 | Dumoulin et al. | 128/653.2 |
| 5,318,025 | 6/1994 | Dumoulin et al. | 128/653.2 |
| 5,396,889 | 3/1995 | Ueda et al. | 128/653.1 |
| 5,398,684 | 3/1995 | Hardy | 128/653.1 |
| 5,485,839 | 1/1996 | Aida et al. | 128/653.1 |

FOREIGN PATENT DOCUMENTS 3931854 4/1991 Germany.
5344964 12/1993 Japan.

*Primary Examiner*—Brian L. Casler
*Attorney, Agent, or Firm*—Jack D. Slobod

[57] ABSTRACT

An imaging system includes to a magnetic resonance device (1) for imaging inter alia human organs by way of magnetic resonance and an X-ray device for imaging by way of X-ray. When interventional techniques are applied in combination with a magnetic resonance device (1), the organs are suitably visualized, but the instruments guided to an organ via an opening in the body are not visible or only hardly so. These instruments must be imaged by means of an X-ray device (20); the patient must then be transported some distance, for example a few meters, in order to obtain distortion-free images of the instruments. Transporting the patient has some drawbacks. There is a risk of motion of the instruments within the patient and, moreover, the coordinate systems of the MR device (1) and the X-ray device (20) might deviate from one another. A solution consists in arranging the X-ray device (20) immediately adjacent to or in the MR device (1), so that the patient need not be transported at all or only over a small distance. The undesired mutual influencing of the MR device (1) and the X-ray device (20) is counteracted, for example by using a solid-state X-ray detector (22) which includes a solid-state image pick-up device and, for example by making the position of the X-ray tube (40) dependent on the static magnetic field of the magnetic resonance device.

19 Claims, 4 Drawing Sheets

IMAGING SYSTEM COMPRISING MAGNETIC RESONANCE AND X-RAY IMAGING DEVICES

BACKGROUND OF THE INVENTION

1. Field of the Invention

The invention relates to an imaging system for imaging a part of an object by way of magnetic resonance and by way of X-ray.

2. Description of the Related Art

Magnetic resonance imaging devices generally include generators for RF electromagnetic signals and for temporary magnetic gradient fields so as to produce magnetic resonance signals in a location-dependent manner, a receiver unit for detecting the magnetic resonance signals, a reconstruction unit for processing the magnets resonance signals received, a support for supporting the object to be imaged, and a control unit for generating control signals for the means for generating the RF electromagnetic signals and the temporary magnetic gradient fields.

For the acquisition of information concerning the nuclear magnetization distribution by means of the described magnetic resonance imaging device, magnetic gradient fields are applied and subsequently successive RF pulses are generated in the static magnetic field by a coil. The spin resonance pulses generated by the RF pulses are received by the same coil or a further coil and applied to a processing unit. The processing unit processes the signals received so as to form images of the part of the object to be examined. The described magnetic resonance devices are used in medical diagnostics for the imaging of soft tissues in, for example human organs with a high content of hydrogen nuclei.

It is a drawback of conventional magnetic resonance devices that when they are used for imaging during interventional procedures in hospitals during which instruments are guided to an organ to be treated via an opening in the body of a patient, these instruments are not adequately imaged. For such imaging of these instruments use is made of an X-ray device whereby the organs to be treated, however, often are not imaged. For the positioning of the instruments, the images of the MR device and the X-ray device are combined, and the patient is transported between the MR device and the X-ray device for the exposures. Contemporary X-ray systems are sensitive to the magnetic stray field generated by the magnets of the MR device, so that the distance between an MR device and an X-ray device must be sufficient, for example a few meters, before acceptable images can be made of the instruments lodged within the patient. During transport there is a risk of motion of the instruments within the patient due to jolting of the patient; such motions could be fatal to the patient. Moreover, in some cases the patient is connected to various other medical apparatus via tubes and other means, so that transport is cumbersome. Furthermore, matching of the coordinate systems of the two devices is difficult, so that errors could be made in the guiding and positioning of said instruments relative to the organ to be treated.

SUMMARY OF THE INVENTION

It is inter alia an object of the invention to mitigate the necessity of transporting the patient, so that the risk of undesirable motion of the instruments within the body of the patient due to jolting during transport is reduced, and to simplify the integration of the coordinate systems of the MR device and the X-ray device, thus reducing the risk of errors in the guiding and positioning of the instruments relative to the organs to be treated.

An imaging system in accordance with the invention is characterized in that it comprises the combination of a magnetic resonance device and an X-ray device, each for forming images of the object when the object is positioned on the support.

Because this combination is implemented in a manner that the X-ray device is present within the field of the static magnet of the MR device, the object, for example a patient, need not be displaced or only hardly so. The risk of motion of the instruments within the patient due to jolting during transport is thus reduced and, because the patient need only be displaced over a short distance, if at all, the transport of the patient with connected tubes and other connection means is simplified. Substantial correspondence is also achieved between the coordinate system of the images of the organs to be treated which are formed by means of the MR device and the coordinate system of the images of the instruments introduced into the body of the patient which are formed by the X-ray device. The risk of errors in the guiding and positioning of instruments within the patient is thus reduced.

A special embodiment of an imaging system in accordance with the invention is characterized in that a moveable part of the system can be adjusted to a first position in which a part of the object is present in an imaging zone of the MR device, and to a second position in which the same part of the object is present in an imaging zone of the X-ray device.

Thus, in the first position MR images of the object, for example a patient, are made without the MR imaging being disturbed by the X-ray device. Such disturbances are, for example, magnetic fields which are caused by eddy currents generated in the metal parts of the X-ray device by the gradient field, and disturbances of the RF field of the MR device by metal parts of the X-ray device. In the second position X-ray images of the patient are made during which the gradient fields and the RF pulses of the MR device are deactivated and notably the disturbing effect of especially the static magnetic fields of the MR device on the X-ray device is counteracted.

A next embodiment of a device in accordance with the invention is characterized in that the X-ray device is arranged adjacent the magnet and comprises a guide system via which the support can be displaced from the first position to the second position and vice versa.

In MR devices in which the combination is implemented in this manner, it is not possible to move an X-ray device to within the shielding of the magnet. An object, for example a patient, positioned on the support, for example a patient table, is transported from the imaging zone of the MR device to the imaging zone of the X-ray device or vice versa, the patient being transported parallel to one axis of the coordinate system of the MR device by the guide system. As a result of this step, the risk of jolting of the patient is reduced, thus reducing the risk of motion of the instruments within the patient. Subsequently, a transformation which includes inter alia a translation along one axis of the coordinate system is required to superpose the images of the MR device and the X-ray device. As a result, an accuracy in the millimeter range is achieved in the positioning of the patient and the instruments relative to both coordinate systems.

A further embodiment of a device in accordance with the invention is characterized in that the imaging zones of the MR device and the X-ray device coincide.

As a result of this implementation, an object, for example a patient, need not be displaced so as to form MR images or X-ray images. For the formation of X-ray images an X-ray device is moved into the zone of the strong magnetic field of the MR device in such a manner that the patient enters the imaging zone of the X-ray device. For the formation of MR images the X-ray device is moved out of the zone of the strong magnetic field again, so that the disturbing effects on the MR images are counteracted. The coordinate systems of the MR device and the X-ray device then substantially register.

Another embodiment of a device in accordance with the invention is characterized in that it comprises means for rotating the X-ray device about the longitudinal axis of the support.

This step enables the formation of X-ray images at different angles of an object, for example a patient, while allowing the object to remain in a fixed position.

A further embodiment of a device in accordance with the invention is characterized in that the X-ray device comprises an X-ray tube in which the direction of an electron beam to be generated therein extends parallel to the magnetic field lines of the static magnetic field to be generated in the X-ray tube by the magnets.

As a result of this feature, the X-ray tube can operate despite the presence of a magnetic stray field caused by the magnets of the MR device. In the absence of a magnetic field, an electron beam in a customary X-ray tube will travel from the cathode to the anode in a substantially straight line, X-rays then being generated in the anode. In the presence of a magnetic field, the electrons are exposed to a force directed perpendicularly to the plane of the electron beam and the magnetic field. The magnitude of this force is proportional to the sine of the angle between the magnetic field and the electron beam. Under the influence of this force, the direction of the electron beam deviates from the desired direction so that it becomes impossible to generate X-rays having the desired properties. By choosing the line between anode and cathode to extend parallel to the direction of the magnetic field, the force exerted on the electron beam by the magnetic field will be zero so that an electron beam can be generated which travels along a substantially straight line between the anode and the cathode.

A further embodiment of a device in accordance with the invention is characterized in that the X-ray device comprises an X-ray detector which includes a solid-state image pick-up device. By providing the X-ray detector with a solid-state image pick-up device, the X-ray detector can generate electronic signals of a distortion-free image of an X-ray shadow image incident on the X-ray detector, despite the presence of magnetic stray fields. Many customary X-ray detectors with an X-ray image intensifier cannot generate electronic signals of a distortion-free image of an X-ray shadow image incident on the X-ray detector. An X-ray image intensifier comprises an entrance window which is provided with photocathode material. The photocathode material converts the X-ray shadow image incident on an entrance window into an electron image and an electron-optical system subsequently images the electron image on a phosphor exit screen. The magnetic stray fields influence the electron beams in the X-ray image intensifier, so that a distorted image is formed on the phosphor exit screen. An X-ray detector comprising a solid-state image pick-up device does not utilize electron beams for imaging, so that distortions cannot arise. A suitable X-ray detector comprises, for example a scintillation screen which is coupled to a solid-state image pick-up device either directly or via a geometrical optical system, the scintillation screen converts the X-ray shadow image directly into a light image.

The solid-state image pick-up device subsequently generates an electronic signal from the light image imaged on the solid-state image pick-up devices.

A further embodiment of a device in accordance with the invention is characterized in that an image processing unit is arranged to carry out the following steps:

a) formation of images by the MR device, b) formation of images by the X-ray device, c) combination of location information of the images formed sub a) and b).

According to this step, information from the MR unit and from the X-ray device is processed in an alternating fashion and the images formed from this information are combined so as to form, for example one image with one reference coordinate system for display on, for example a monitor.

BRIEF DESCRIPTION OF THE DRAWING

The above and other, more detailed aspects of the invention will be described in detail hereinafter, by way of example, with reference to the drawing, wherein.

DESCRIPTION OF THE PREFERRED EMBODIMENTS

Figure 1:
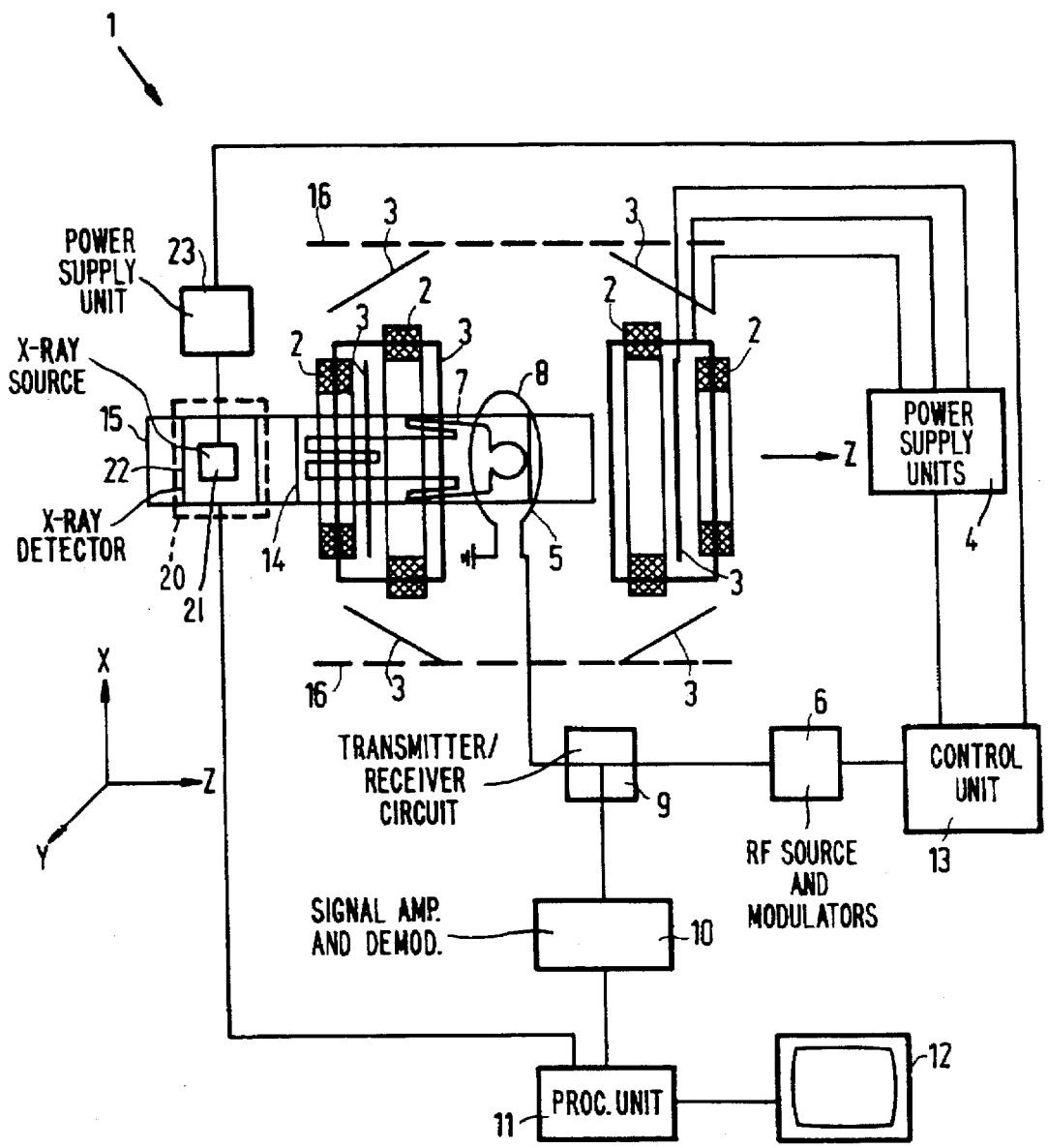
FIG. 1 shows a first embodiment of an MR device with a closed magnet system and an X-ray device.

FIG. 1 shows a magnetic resonance device 1 which comprises an X-ray device 20 in accordance with the invention. The MR device 1 comprises a first magnet system 2 or "magnet" for generating a static magnetic field, a second magnet system 3 for generating gradient fields, and power supply units 4 for the first magnet system 2 and the second magnet system 3. The magnet systems 2 and 3 are shielded by means of a shield 16. The z-direction of the coordinate system shown corresponds to the direction of the static magnetic field in the magnet system 2. An RF transmitter coil 5 serves to generate RF magnetic fields and is connected to an RF source and modulator 6. A receiver coil 8 is used to receive the resonance signal generated by the RF field in the object 7 to be examined, for example a patient. This coil may be the same coil as the RF transmitter coil 5. It is connected, via a transmitter/receiver circuit 9, to a signal amplifier and demodulation unit 10. The phase and amplitude derived from this circuit are applied to a processing unit 11. The processing unit 11 processes the signals presented so as to form an image of a part of the patient; this image is displayed, for example on a monitor 12. The control unit 13 controls the modulator 6 for the RF transmitter and the power supply units 4 for the magnetic gradient fields. The RF transmitter coil 5 is arranged within the magnet system 2 and encloses an examination space which is large enough to examine the patient for medical diagnostic purposes. Thus, a static magnetic field, a gradient field for inter alia generating location-dependent information of the object, and a spatially uniform RF field to be generated are present within the examination space in order to form MR images.

The X-ray device 20 is arranged adjacent the MR device 1. The X-ray device, therefore, is present in the static stray field caused by the magnet of the MR device. The distance between the MR device 1 and the X-ray device 20 is, for example 10 cm. The X-ray device 20 is provided, for example with a power supply unit 23, an X-ray source 21 and an X-ray detector 22. During formation of an X-ray image, an X-ray source 21 in the X-ray device 20 generates an X-ray beam whereto the patient 7 in the examination space is exposed. An X-ray shadow image is formed on the entrance window of the X-ray detector 22 by absorption of the X-ray beam in the patient 7. The X-ray detector 22 generates electric image signals which are applied to the processing unit 11. The information of these images is combined with the information of the images of the MR device in the processing unit 11 so as to be stored and displayed on, for example the monitor 12. The examination zone of the MR device 1 and the examination zone of the X-ray device 20 are situated one in the prolongation of the other. A guide system 15 is arranged in these zones. On the guide system 15 there is mounted a support 14, for example a patient table. The patient 7 on the patient table 14 is transported from the MR device 1 to the X-ray device 20 and vice versa via said guide system 15.

Because the patient is displaced along the z-axis of the coordinate system by way of the guide system 15 forming part of the MR device, the risk of jolting of the patient is reduced. The risk of motion of the instruments present in the body of the patient during an interventional procedure is thus reduced. A transformation is applied to combine coordinate systems of the images of the MR device and the X-ray device, so that the risk of errors in, for example the positioning of instruments within the patient is mitigated.

Figure 2:
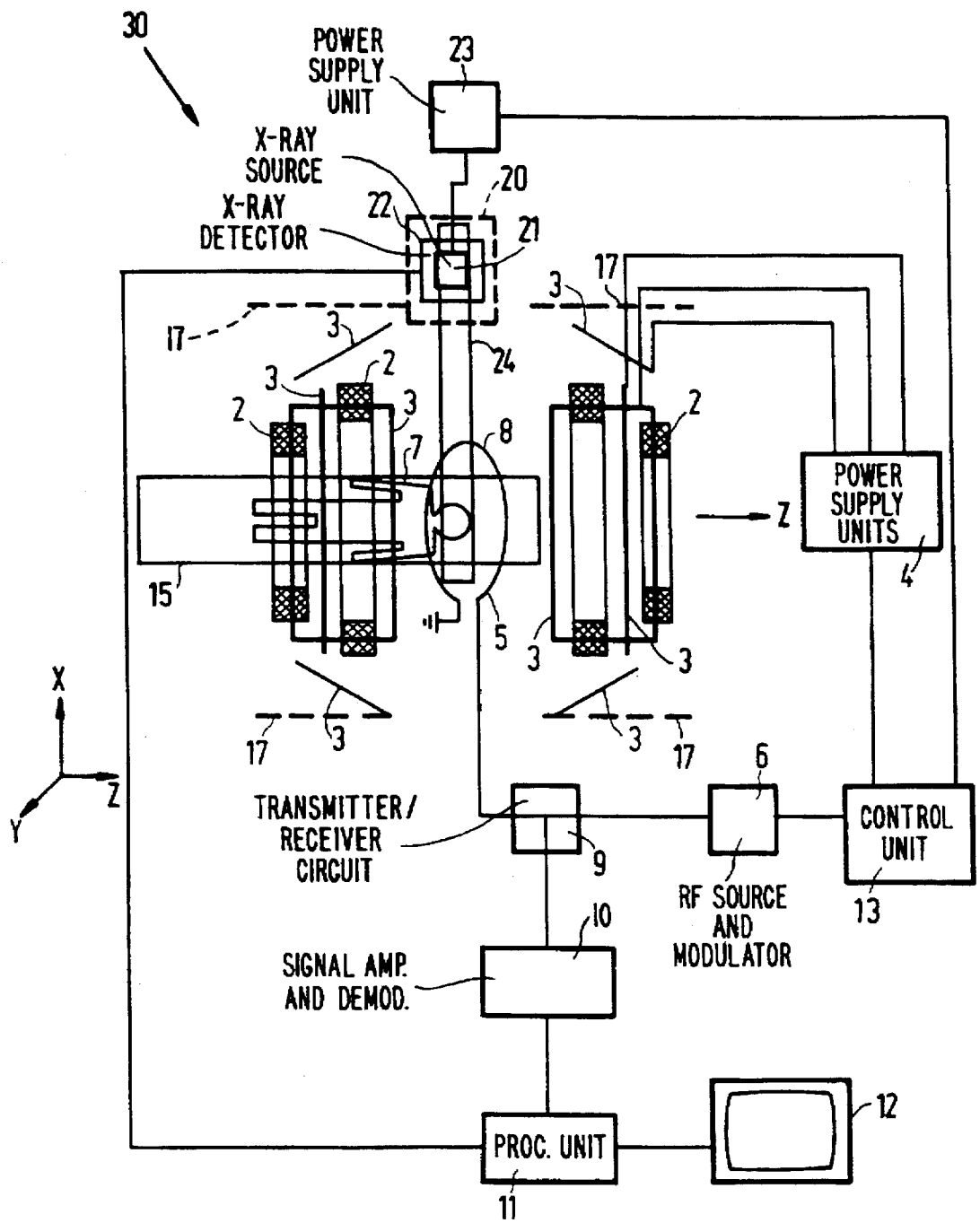
FIG. 2 shows a further embodiment of an MR device with a double-donut magnet system and an X-ray device.

FIG. 2 shows an MR device 30 which comprises a double-donut magnet system for generating the static magnetic field and an X-ray device 20 in accordance with the invention. Because the shielding 17 is in this case interrupted between the coils of the first magnet system 2, in this set-up the X-ray device 20 can be arranged in the space between the two coils of the magnet system 2. The operation of the MR device 1 and the X-ray device 20 is similar to that described with reference to FIG. 1. The X-ray device 20 is mounted on a displaceable holder 24 in the MR device 1, so that the X-ray device 20 can be displaced and the imaging zone of the X-ray device 20 coincides with the imaging zone of the MR device 1 and an X-ray image can be formed of a part of an object 7, for example a patient. After the formation of an X-ray image, the X-ray device 20 is removed from the MR device again. In this device the images of the MR device and the X-ray device are substantially coincident and the patient need not be displaced. Besides the described magnet systems for generating the static fields of an MR device, use can also be made, for example of a C-core magnet system where the patient is arranged between two magnet shoes.

Figure 3:
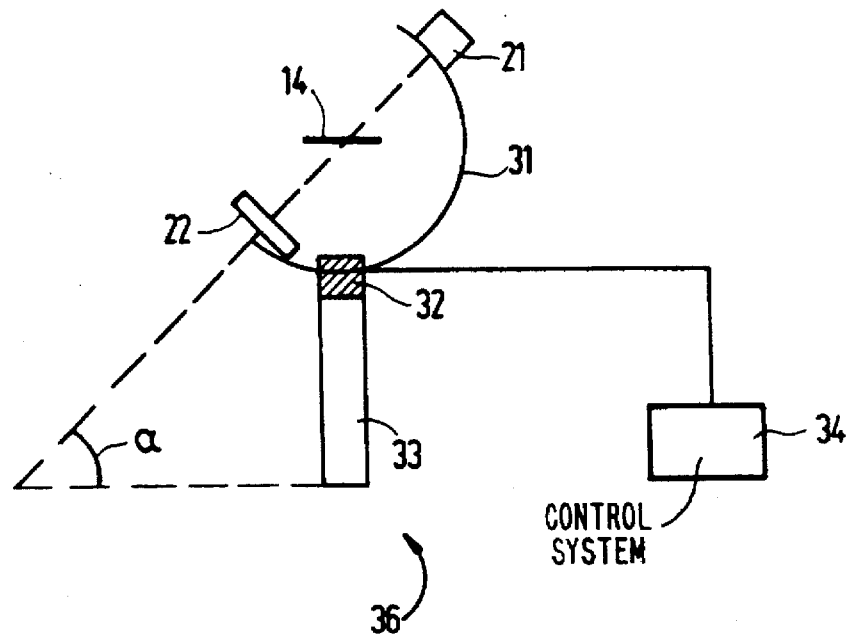
FIG. 3 shows a rotating X-ray system.

FIG. 3 shows an embodiment of a rotary X-ray device 36 as can be used, for example in a device in accordance with the invention. In the rotary X-ray device 36 the X-ray source 21 and the X-ray detector 22 are arranged so as to be rotatable as a unit about the longitudinal axis of a support 14, for example a patient table. The X-ray device 36 also comprises a C-arm 31, a drive system 32, and stand 33. The X-ray source 21 is mounted on the inner side of the C-arm 31 and the X-ray detector 22 is mounted opposite the X-ray source 21 on the inner side of the C-arm 31. The C-arm 31 is mounted on the stand 33, together with the drive system 32. The drive system is connected to a control system 34 whereby, for example an angle α between the direction of the X-ray beam and the patient table is adjusted.

The C-arm 31 may also be constructed, for example so as to include a biplanar X-ray device so that the location of the instruments in the body of a patient can be carried out faster.

Figure 4:
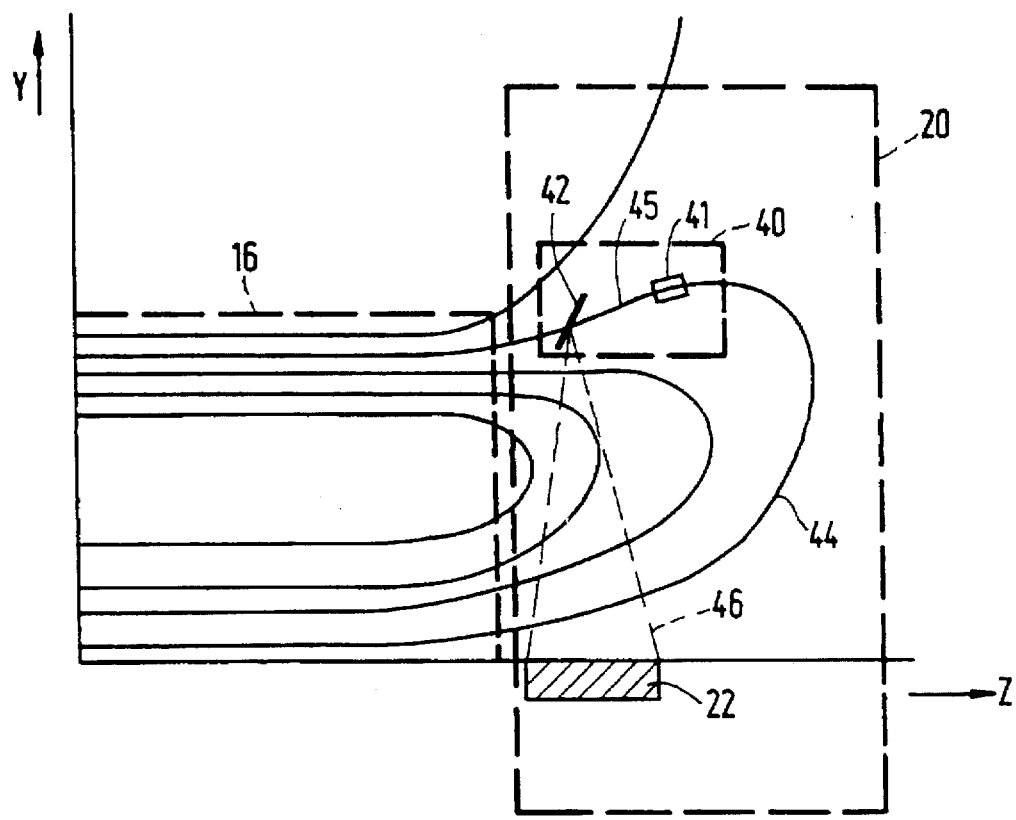
FIG. 4 shows an example of a position of an X-ray tube in an Y-Z coordinate system.

FIG. 4 shows diagrammatically an Y-Z coordinate system together with, by way of example, the positions of an X-ray device 20 and its X-ray tube 40 in a device in accordance with the invention. In this position, adjacent the shielding 16 of the MR device 1, the X-ray tube 40 can generate X-rays. In the Figure a field line 44 of the static magnetic field of the MR device 1 is shown parallel to the direction of the electron beam 45 in the X-ray tube 40. The electrons emanating from the cathode in the direction of the anode can spiral, due to the magnetic field, with a radius r which is given by $r = mv/qB$, in which m is the mass of the electron, v is the velocity and q is the charge. When an electron has been subjected to the maximum acceleration due to the electric field of 30 kV between anode and cathode, the speed is $10^8$ m/s; this speed is not determined relativistically. When the magnetic field has a strength of 1.5 T and extends perpendicularly to the electron beam, the maximum radius of a spiraling electron beam is 0.389 mm. Therefore, because of the electric field between the anode 42 and the cathode 41 the mean direction of an electron beam 45 will form a substantially straight line from the cathode 41 to the anode 42. The anode 42 is struck by the electron beam 45, thus generating an X-ray beam 46 which produces a shadow image of an object, for example a patient, on the X-ray detector 22. The X-ray tube 40 can also be arranged at an adequate distance from the MR device 1 at an area where the static magnetic stray field is weak enough to be shielded without distorting the static field in the MR device. The X-rays generated in the X-ray tube 40 are then conducted to the patient, for example by means of a Kumakhov lens as is known from the Patent Application WO92/08235.

Figure 5:
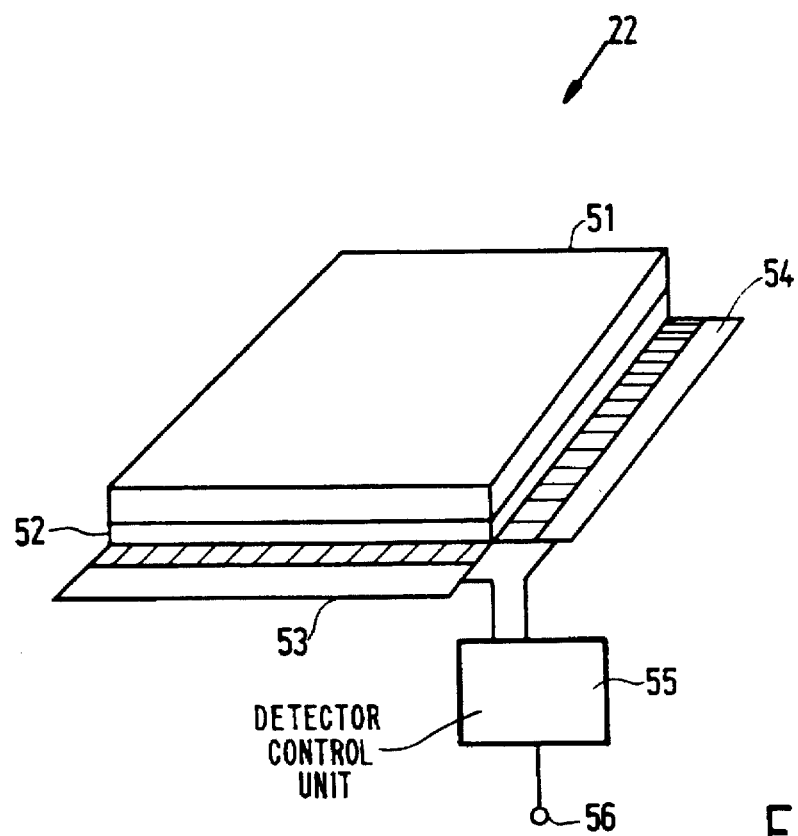
FIG. 5 shows an first example of an X-ray detector, provided with a solid-state image pick-up device.

FIG. 5 shows an embodiment of an X-ray detector 22 as can be used, for example in a device in accordance with the invention. It concerns a solid-state X-ray detector as is known, for example from European Patent Application 0440282. The solid-state X-ray detector comprises a scintillation screen 51 of, for example caesium iodide (CsI) whereto a matrix 52 of amorphous silicon photodiodes and thin-film transistors is coupled. The matrix comprises, for example 1024×1024 pixels. Each pixel comprises a photodiode and a thin-film transistor. The X-ray shadow image formed on the scintillation screen 51 is converted thereby into a light image which is converted into a charge image on the pixels by the photodiodes. The pixels are read one row after the other by means of row selection registers 53 and charge-sensitive preamplifiers 54. The row selection registers 53 are controlled by a detector control unit 55 which also comprises analog-to-digital converters. In the analog-to-digital converters the analog image signals are converted into digital information which, after image correction, becomes available on the output 56. Thus, for example 25 images are formed per second.

Figure 6:
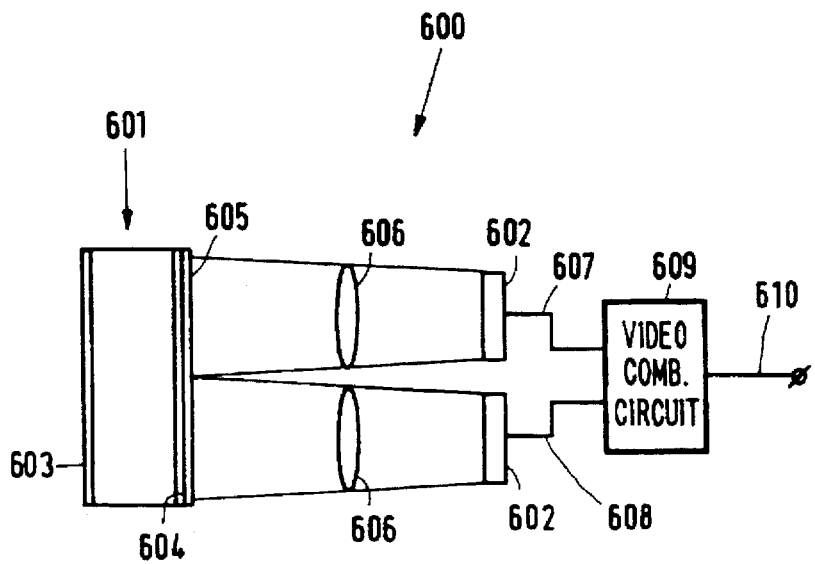
FIG. 6 shows a second example of an X-ray detector provided with two solid-state image pick-up devices and a geometrical optical system.

Another embodiment of an X-ray detector which is suitable for use in a device in accordance with the invention and which is also insensitive to static magnetic fields is formed by an X-ray detector provided with an X-ray conversion screen which is coupled to solid-state image pick-up devices via a geometric optical system. The operation of such an X-ray detector will be described with reference to FIG. 6. The X-ray detector 600 is provided with an aluminum entrance window 603 and a scintillation screen 601. the scintillation screen 601 contains, for example a compound consisting of CsI and Tl. the scintillation screen 601 converts an X-ray image progected onto the entrance screen 603 into visible light. A multi-layer interference filter 604 transports the light generated to the rear 605 of the scintillation screen 601. A geometric optical system 606 subsequently images the light image on the rear 605 of the scintillation screen 601 onto two solid-state image pick-up divices 602. A suitable geometric optical system 606 is, for example an optical system comprising lenses having a large numerical aperture.

It is also possible to use a geometric optical system comprising several tapered-fiber optical systems. A tapered-fiber optical system comprises a bundle of optical fibers in which each optical fiber comprises a first end of a first diameter and a second end of a second diameter. The magnification factor of the tapered-fibre optical system is determined by the ratio of the first to the second diameter. Each of the tapered-fiber optical systems images a part of the image of the rear 605 of the scintillation screen 601 onto a solid-state image pick-up device 602.

Suitable solid-state image pick-up devices 602 are, for example those of the frame transfer type such as the Philips type FT14. The solid-state image pick-up devices 602 convert the various parts of the light image into a first electric video signal 607 and a second electric video signal 608. A video combination circuit 609 combines the first electric video sognal 607 and the second electric video signal 608 of the solid-state image pick-up devices 602 into a single video signal 610. The combined video signal 610 is displayed by a monitor 12.

In order to enhance the sensitivity, instead Of a scintillation screeen 601 which converts X-rays into visible light, use can be made of a scintillation screen 601 which converts the X-ray into infrared ligth. The infrared light contains wavelengths in the range between 800 nm and 1200 nm. Because the sensitivity of the solid-state image pick-up devices 602 to infrared light is higher, the sensitivity of the X-ray detector is thus enhanced.

A possibility of generating an X-ray image by means of conventional X-ray detectors, for example is the use of compensating magnetic fields at the area of the X-ray detector in order to compensate for the stray field of the magnets of the MR device. For normal, substantially distortion-free operation it is necessary that the magnetic field at the area of the X-ray detector does not exceed approximately 4 Gauss. For example, when large correction coils are arranged against the walls of the examination zone, and an acceptable current flows through the conductors of these correction coils, a stray field of, for example 50 Gauss can be reduced to field values which are below the maximum permissible field values specified for the X-ray detector. An additional disturbance, if any, of the main magnetic field within the core of the MR system by the correction coils can be simply corrected by shimming the magnet as is already common practice in correcting inhomogeneities of the main magnetic field which are due to other causes. The X-ray system can thus be clinically used at a distance of, for example 2 meters. If this facility were not provided, this distance might even have to be 4 meters. As a result of the smaller distance, the transport of the patient between the MR device and the X-ray device is simplified.

Alternative embodiments concern the use of linear or higher-order correction coils if a non-homogeneous stray field is to be reduced at the area of the X-ray detector. The mounting of the correction coils in locations other than the walls of the examination space, for example closely around the X-ray detector, is also possible. If the detector is to be moved in a zone in which the stray field varies significantly, the correction could be controlled in a location-dependent manner. This method of locally reducing the stray field of the magnet can be used not only upon installation of an X-ray device, but also if other apparatus such as, for example anaesthetic apparatus which is also affected by the stray field, is to be installed closer to the MR device.

We claim:

1. A system for imaging a part of an object, said system comprising a combination of a magnetic resonance imaging device including a magnet for generating a static magnetic field and an X-ray imaging device having coincident imaging zones, there being a support common to the magnetic resonance imaging device and the X-ray imaging device for supporting the object to be imaged during imaging, and a moveable part which can be adjusted to a first position in which the magnetic resonance imaging device is arranged to image a part of the object present in the imaging zone of said magnetic resonance imaging device substantially without said X-ray imaging device disturbing the static magnetic field produced by the magnet, and a second position in which the X-ray imaging device is arranged to image said part of the object present in the imaging zone of the X-ray imaging device substantially without the static magnetic field of said magnetic resonance imaging device disturbing said X-ray imaging device, said moveable part being moveable without moving the support.

2. An imaging system as claimed in claim 1, wherein the X-ray imaging device comprises an X-ray source and an X-ray detector spaced apart from said X-ray source along an X-ray axis which source, detector and axis are rotatable as a unit, and means for rotating the X-ray source, X-ray detector and X-ray axis as a unit about a longitudinal axis of the support.

3. An imaging system as claimed in claim 2, wherein the X-ray imaging device comprises an X-ray tube oriented such that when the moveable device is in said second position a direction of an electron beam to be generated within the X-ray tube extends parallel to magnetic field lines of the static magnetic field to be generated in the X-ray tube by the magnet of the magnetic resonance imaging device.

4. An imaging system as claimed in claim 3, wherein the X-ray device comprises an X-ray detector which includes a solid-state image pick-up device.

5. An imaging system as claimed in claim 2, wherein the X-ray device comprises an X-ray detector which includes a solid-state image pick-up device.

6. An imaging system as claimed in claim 1, wherein the X-ray imaging device comprises an X-ray tube oriented such that when the moveable device is in said second position a direction of an electron beam to be generated within the X-ray tube extends parallel to magnetic field lines of the static magnetic field to be generated in the X-ray tube by the magnet of the magnetic resonance imaging device.

7. An imaging system as claimed in claim 6, wherein the X-ray device comprises an X-ray detector which includes a solid-state image pick-up device.

8. An imaging system as claimed in claim 1, wherein the X-ray device comprises an X-ray detector which includes a solid-state image pick-up device.

9. An imaging system as claimed in claim 1, further comprising an image processing unit which is arranged to carry out the following:
   a) formation of images by the magnetic resonance device,
   b) formation of images by the X-ray device,
   c) combination of information from the images formed by the magnetic resonance device and the X-ray device.

10. A system for imaging a part of an object, said system comprising a combination of a magnetic resonance imaging device including a magnet for generating a static magnetic field and an X-ray imaging device having respective imaging zones, there being a support common to the magnetic resonance imaging device and the X-ray imaging device for supporting the object to be imaged during imaging, and a moveable part which can be adjusted to a first position in which the magnetic resonance imaging device is arranged to image a part of the object present in the imaging zone of said magnetic resonance imaging device substantially without said X-ray imaging device disturbing the static magnetic field produced by the magnet, and a second position in which the X-ray imaging device is arranged to image said part of the object present in the imaging zone of the X-ray imaging device substantially without the static magnetic field of said magnetic resonance imaging device disturbing said X-ray imaging device, wherein the X-ray imaging device comprises an X-ray tube oriented such that when the moveable device is in said second position a direction of an electron beam to be generated within the X-ray tube extends parallel to magnetic field lines of the static magnetic field to be generated in the X-ray tube by the magnet of the magnetic resonance imaging device.

11. An imaging system as claimed in claim 10, wherein the X-ray imaging device is arranged adjacent the magnet and said support is the moveable part, and further comprising a guide system via which the support can be displaced from the first position to the second position and vice versa.

12. An imaging system as claimed in claim 11, wherein the X-ray imaging device further comprises an X-ray detector spaced apart from said X-ray source along an X-ray axis which source, detector and axis are rotatable as a unit, and means for rotating the X-ray source, X-ray detector and X-ray axis as a unit about a longitudinal axis of the support.

13. An imaging system as claimed in claim 12, wherein the X-ray device comprises an X-ray detector which includes a solid-state image pick-up device.

14. An imaging system as claimed in claim 11, wherein the X-ray device comprises an X-ray detector which includes a solid-state image pick-up device.

15. An imaging system as claimed in claim 10, wherein the X-ray imaging device further comprises an X-ray detector spaced apart from said X-ray source along an X-ray axis which source, detector and axis are rotatable as a unit, and means for rotating the X-ray source, X-ray detector and X-ray axis as a unit about a longitudinal axis of the support.

16. An imaging system as claimed in claim 10, wherein the X-ray imaging device further comprises an X-ray detector spaced apart from said X-ray source along an X-ray axis which source, detector and axis are rotatable as a unit, and means for rotating the X-ray source, X-ray detector and X-ray axis as a unit about a longitudinal axis of the support.

17. An imaging system as claimed in claim 16, wherein the X-ray device comprises an X-ray detector which includes a solid-state image pick-up device.

18. An imaging system as claimed in claim 10, wherein the X-ray device comprises an X-ray detector which includes a solid-state image pick-up device.

19. An imaging system as claimed in claim 10, further comprising an image processing unit which is arranged to carry out the following:
   a) formation of images by the magnetic resonance device,
   b) formation of images by the X-ray device,
   c) combination of information from the images formed by the magnetic resonance device and the X-ray device.

* * * * *